United States Patent
Kikunaga et al.

(10) Patent No.: US 11,441,109 B2
(45) Date of Patent: Sep. 13, 2022

(54) CLEANING SOLUTION FOR REMOVING DRY ETCHING RESIDUE AND METHOD FOR MANUFACTURING SEMICONDUCTOR SUBSTRATE USING SAME

(71) Applicant: MITSUBISHI GAS CHEMICAL COMPANY, INC., Chiyoda-ku (JP)

(72) Inventors: Takahiro Kikunaga, Katsushika-ku (JP); Hiroaki Horie, Katsushika-ku (JP); Kimihiro Aoyama, Katsushika-ku (JP); Nobuo Tajima, Katsushika-ku (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 61 days.

(21) Appl. No.: 16/980,287

(22) PCT Filed: Mar. 5, 2019

(86) PCT No.: PCT/JP2019/008639
§ 371 (c)(1),
(2) Date: Sep. 11, 2020

(87) PCT Pub. No.: WO2019/176652
PCT Pub. Date: Sep. 19, 2019

(65) Prior Publication Data
US 2021/0047594 A1    Feb. 18, 2021

(30) Foreign Application Priority Data
Mar. 14, 2018 (JP) .............................. JP2018-046290

(51) Int. Cl.
*C11D 7/32* (2006.01)
*C11D 17/08* (2006.01)
(Continued)

(52) U.S. Cl.
CPC ............ *C11D 17/08* (2013.01); *C11D 7/3209* (2013.01); *C11D 7/3218* (2013.01);
(Continued)

(58) Field of Classification Search
CPC ................................................... C11D 11/0047
(Continued)

(56) References Cited

U.S. PATENT DOCUMENTS

2002/0077259 A1* 6/2002 Skee ................. H01L 21/02071
510/175
2003/0181344 A1    9/2003 Ikemoto et al.
(Continued)

FOREIGN PATENT DOCUMENTS

JP          5-287300 A     11/1993
JP       2011-159658 A      8/2011
(Continued)

OTHER PUBLICATIONS

Extended European Search Report dated Apr. 16, 2021 in European Patent Application No. 19768464.0, 8 pages.
(Continued)

*Primary Examiner* — Gregory E Webb
(74) *Attorney, Agent, or Firm* — Oblon, McClelland, Maier & Neustadt, L.L.P.

(57) ABSTRACT

The present invention can provide a cleaning solution containing 0.2-20 mass % of an amine compound (A), 40-70 mass % of a water-soluble organic solvent (B), and water, wherein the amine compound (A) contains at least one selected from the group consisting of n-butylamine, hexylamine, octylamine, 1,4-butanediamine, dibutylamine, 3-amino-1-propanol, N,N-diethyl-1,3-diaminopropane, and bis(hexamethylene)triamine, and the water-soluble organic solvent (B) has a viscosity of 10 mPa·s or less at 20° C. and a pH of 9.0-14.

20 Claims, 1 Drawing Sheet

(51) Int. Cl.
*C11D 7/50* (2006.01)
*C11D 11/00* (2006.01)
*H01L 21/02* (2006.01)
*H01L 21/3213* (2006.01)

(52) U.S. Cl.
CPC ........ *C11D 7/5022* (2013.01); *C11D 11/0047* (2013.01); *H01L 21/0206* (2013.01); *H01L 21/02071* (2013.01); *H01L 21/02178* (2013.01); *H01L 21/32138* (2013.01)

(58) Field of Classification Search
USPC ........................................................ 510/175
See application file for complete search history.

(56) References Cited

U.S. PATENT DOCUMENTS

| | | | | |
|---|---|---|---|---|
| 2004/0256358 | A1* | 12/2004 | Shimizu | H01L 21/02052 216/83 |
| 2007/0060490 | A1* | 3/2007 | Skee | C11D 7/06 510/175 |
| 2012/0048295 | A1* | 3/2012 | Du | C11D 7/3245 134/3 |
| 2015/0159124 | A1* | 6/2015 | Takahashi | C23G 1/18 510/175 |
| 2015/0259632 | A1 | 9/2015 | Nakanishi et al. | |
| 2016/0179011 | A1* | 6/2016 | Agarwal | C11D 7/265 510/176 |
| 2016/0186105 | A1 | 6/2016 | Liu et al. | |
| 2017/0240850 | A1 | 8/2017 | Oie et al. | |
| 2019/0079409 | A1* | 3/2019 | Takahashi | C11D 7/04 |

FOREIGN PATENT DOCUMENTS

| | | |
|---|---|---|
| JP | 2013-157516 A | 8/2013 |
| JP | 2016-127291 A | 7/2016 |
| WO | WO 2016/076033 A1 | 5/2016 |
| WO | WO 2017/119350 A1 | 7/2017 |
| WO | WO 2017/208767 A1 | 12/2017 |

OTHER PUBLICATIONS

International Search Report dated Apr. 23, 2019 in PCT/JP2019/008639 filed Mar. 5, 2019, 2 pages.

* cited by examiner

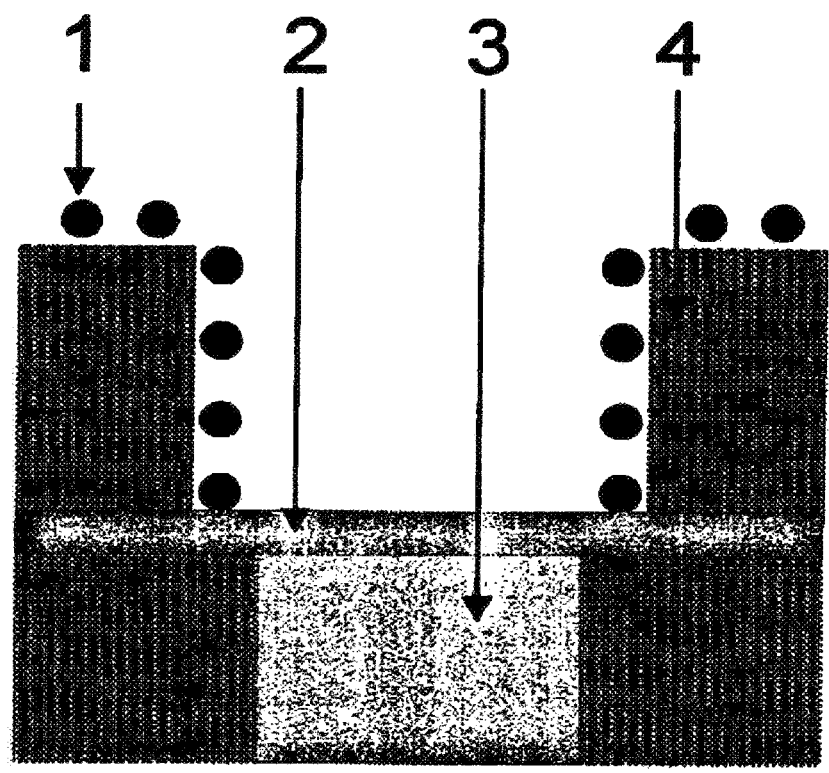

CLEANING SOLUTION FOR REMOVING DRY ETCHING RESIDUE AND METHOD FOR MANUFACTURING SEMICONDUCTOR SUBSTRATE USING SAME

TECHNICAL FIELD

The present invention relates to a cleaning solution for removing dry etching residue and a dry etching-stopper layer from the treated surface while suppressing damage to a cobalt-containing metal wiring layer and an interlayer dielectric film in a step for manufacturing a semiconductor substrate, and a method for manufacturing a semiconductor substrate using the same.

BACKGROUND ART

One of the steps for manufacturing a semiconductor substrate is a dry etching step, which includes a step of selectively removing a specific material from other materials. In doing so, a cleaning solution is used to remove residue that remains uncorroded after etching (namely, dry etching residue), metal debris and the like that remain on the surface after the etching treatment.

In recent semiconductor substrates, copper is employed as a wiring material, while a low dielectric constant film (hereinafter, referred to as a "Low-k film") is employed as an interlayer dielectric film. As the wiring miniaturization advances, however, electromigration became more likely to be caused and thus reduction of reliability of the copper wirings has been an issue. Therefore, cobalt has been proposed as an alternative material for improving the electromigration resistance. Meanwhile, when a substrate including this wiring material is subjected to dry etching, organic or silicon dry etching residue remains on the surface of the treated substrate. Furthermore, in order to prevent damage to the wiring material by dry etching, the semiconductor substrate may include a dry etching-stopper layer such as aluminum oxide.

Hence, there is a need for a cleaning technique for removing the dry etching residue and the dry etching-stopper layer while preventing corrosion of the wiring material and the interlayer dielectric film of the substrate. Moreover, there is also a need to suppress side etching of the dry etching-stopper layer (e.g., aluminum oxide), which is an unfavorable phenomenon for the film forming step following the cleaning.

In order to loosen the dry etching residue, a redox agent is sometimes used in a cleaning solution. Redox agents, however, have problems of inducing deterioration of the performance due to decomposition of the component contained in the cleaning solution, inducing change in the quality of the material of the substrate surface, and the like.

Furthermore, while an anticorrosive agent is sometimes used to prevent damage to the wiring material, an anticorrosive agent adsorbed onto the surface of the wiring material needs to be removed without causing disturbance in the film forming step following the cleaning. Although a nitrogen-containing heterocyclic compound is a typical anticorrosive agent for cobalt, it cannot be removed easily from the surface of the wiring material with a general cleaning solution.

As a cleaning solution directed to a substrate including a cobalt wiring material, one known cleaning method uses a liquid chemical composed of a hydroxylamine compound, a nitrogen-containing compound having a specific structure, an organic solvent and water (Patent document 1). This method, however, uses a hydroxylamine compound as a reducing agent to dissolve the residue. Moreover, a nitrogen-containing heterocyclic compound as an anticorrosive agent needs to be added, or else damage to cobalt cannot be sufficiently suppressed.

As a cleaning solution directed to a substrate including a cobalt wiring material, another known cleaning technique uses a liquid chemical composed of an alkali metal compound, a peroxide, an alkaline earth metal and water (Patent document 2). This technique, however, uses a peroxide as an oxidant in order to dissolve the dry etching residue, and therefore damage to cobalt cannot be suppressed unless an anticorrosive agent is added.

PRIOR ART DOCUMENTS

Patent Documents

Patent document 1: International Patent Application Publication WO2017-119350
Patent document 2: International Patent Application Publication WO2016-076033

SUMMARY OF THE INVENTION

Problems to be Solved by the Invention

The objective of the present invention is to provide a cleaning solution which is capable of removing dry etching residue and a dry etching-stopper layer while preventing corrosion of a cobalt-containing metal wiring layer and an interlayer dielectric film, which has been difficult to realize by conventional methods, and a method for manufacturing a cobalt-containing semiconductor substrate using the same.

Means for Solving the Problems

The present inventors have gone through intensive studies, and as a result of which found that the above-described problem can be solved by using a cleaning solution containing a specific amine compound (A), a water-soluble organic solvent (B) and water.

Thus, the present invention is as follows.
<1> A cleaning solution comprising 0.2-20 mass % of an amine compound (A), 40-70 mass % of a water-soluble organic solvent (B) and water, wherein:
the amine compound (A) contains one or more selected from the group consisting of n-butylamine, hexylamine, octylamine, 1,4-butanediamine, dibutylamine, 3-amino-1-propanol, N,N-diethyl-1,3-diaminopropane and bis(hexamethylene)triamine;
the water-soluble organic solvent (B) has a viscosity of 10 mPa·s or less at 20° C.; and
pH is in a range of 9.0-14.
<2> The cleaning solution according to <1> above, wherein the content of the amine compound (A) is 0.2-4.0 mass %.
<3> The cleaning solution according to <1> or <2> above, wherein the content of water is 28-59 mass %.
<4> The cleaning solution according to any one of <1> to <3> above, wherein the water-soluble organic solvent (B) contains one or more selected from the group consisting of diethylene glycol monomethyl ether, diethylene glycol monobutyl ether, triethylene glycol monomethyl ether, dipropylene glycol monomethyl ether and N,N-dimethyl isobutylamide.

<5> The cleaning solution according to any one of <1> to <4> above, wherein the amine compound (A) contains one or more selected from the group consisting of 3-amino-1-propanol, N,N-diethyl-1,3-diaminopropane and bis(hexamethylene)triamine.

<6> The cleaning solution according to any one of <1> to <5> above, which is used for removing dry etching residue.

<7> A method for manufacturing a semiconductor substrate, comprising the step of cleaning a cobalt-containing semiconductor substrate with the cleaning solution according to any one of <1> to <6> above.

<8> The method for manufacturing a semiconductor substrate according to <7> above, wherein the semiconductor substrate comprises a cobalt-containing metal wiring layer, an interlayer dielectric film and a dry etching-stopper layer containing aluminum oxide.

Advantageous Effect of the Invention

The present invention can provide a cleaning solution capable of selectively removing dry etching residue and a dry etching-stopper layer from the surface of a substrate while suppressing damage to a cobalt-containing metal wiring layer and an interlayer dielectric film in a step for manufacturing a semiconductor substrate, and a method for manufacturing a semiconductor substrate using the same.

BRIEF DESCRIPTION OF THE DRAWINGS

FIG. 1 is a schematic cross-sectional view showing an exemplary cobalt-containing semiconductor substrate before removing dry etching residue.

EMBODIMENTS FOR CARRYING OUT THE INVENTION

A cleaning solution of the present invention comprises a specific amine compound (A), a water-soluble organic solvent (B) and water. Detailed description will be provided hereinbelow.

[Amine Compound (A)]

An amine compound (A) used in the present invention comprises one or more selected from specific amine compounds from the perspective of anti-corrosion property for cobalt.

Specifically, examples of the specific amine compounds include n-butylamine, hexylamine, octylamine, 1,4-butanediamine, dibutylamine, 3-amino-1-propanol, N,N-diethyl-1,3-diaminopropane and bis(hexamethylene)triamine. Among them, 3-amino-1-propanol, N,N-diethyl-1,3-diaminopropane and bis(hexamethylene)triamine are favorable as they are less volatile under a high temperature condition. They are readily available as commercial products that are favorable to be used.

The content of the amine compound (A) in the cleaning solution is in a range of 0.2-20 mass %, preferably in a range of 0.2-8.0 mass %, more preferably in a range of 0.2-4.0 mass % and particularly preferably in a range of 0.5-4.0 mass %. As long as the content is in this range, both the property of removing the dry etching residue and the property of removing the dry etching-stopper layer containing aluminum oxide can be achieved.

If the amount used is too large, the property of removing the dry etching-stopper layer containing aluminum oxide becomes strong, which may increase the amount of side etching of the dry etching-stopper layer containing aluminum oxide. On the other hand, if the amount used is too small, the properties of removing the dry etching residue and the dry etching-stopper layer containing aluminum oxide may be insufficient.

[Water-Soluble Organic Solvent (B)]

A water-soluble organic solvent (B) used for the present invention is a water-soluble solvent with a viscosity of 10 mPa·s or less at 20° C.

Specifically, favorable examples include diethylene glycol monomethyl ether (hereinafter, DGME), diethylene glycol monobutyl ether (hereinafter, DGMB), triethylene glycol monomethyl ether (hereinafter, TGME), dipropylene glycol monomethyl ether (hereinafter, DPGMG) and N,N-dimethyl isobutylamide (hereinafter, DMIB). They are readily available as commercial products that are favorable to be used. Alternatively, two or more of them may be used in combination.

The content the water-soluble organic solvent (B) in a cleaning solution is in a range of 40-70 mass %, and preferably in a range of 45-65 mass %. If the amount used is too small, the property of removing the dry etching-stopper layer containing aluminum oxide becomes high, which may increase the amount of side etching of the dry etching-stopper layer containing aluminum oxide. In addition, the anti-corrosion property for cobalt may be insufficient. On the other hand, if the amount used is too large, the property of removing the dry etching-stopper layer containing aluminum oxide may be deteriorated, which may require longer cleaning time.

[Water]

While water used for the present invention is not particularly limited, and may be tap water, industrial water, groundwater, distilled water, ion-exchanged water, ultrapure water or the like, it is preferably ion-exchanged water and more preferably ultrapure water.

The content of water in the cleaning solution is preferably in a range of 28-59 mass %, and more preferably in a range of 34-54 mass %.

[Cleaning Solution]

The cleaning solution of the present invention can be prepared by homogeneously agitating the above-described amine compound (A), water-soluble organic solvent (B) and water according to a general process.

The pH of the cleaning solution is 9.0-14, and preferably 11-13. If the pH is too low, the property of removing the dry etching-stopper layer containing aluminum oxide and the anti-corrosion property for cobalt will be deteriorated, whereas if the pH is too high, the property of removing the dry etching-stopper layer containing aluminum oxide becomes strong, which may increase the side etching of the dry etching-stopper layer containing aluminum oxide.

While the pH can be regulated only by the content of the amine compound (A), an acid may also be added as long as the purpose of the present invention is not impaired.

[Semiconductor Substrate]

A semiconductor substrate manufactured using the cleaning solution of the present invention is preferably provided with a cobalt-containing metal wiring layer, an interlayer dielectric film and a dry etching-stopper layer, where residue remains on the surface of the substrate after dry etching. The present invention is particularly effective when the semiconductor substrate has residue of a mask pattern (organic compound residue) as the dry etching residue. In addition, the above-described interlayer dielectric film may include a low dielectric constant film (Low-k film). Furthermore, the above-described dry etching-stopper layer preferably contain aluminum oxide.

[Method for Manufacturing Semiconductor Substrate]

A method for manufacturing a semiconductor substrate of the present invention comprises a step of cleaning a cobalt-containing semiconductor substrate with the above-described cleaning solution of the present invention.

For example, the cleaning solution of the present invention can be used in a process of an immersion treatment or a single-wafer treatment for a semiconductor substrate that had been subjected to a dry etching treatment. The treatment temperature is usually 10-70° C. and preferably 40-60° C. The treatment time is usually 0.5-10 minutes and preferably 1-5 minutes. While rinsing with water may be sufficient, an organic solvent such as alcohol or ammonia water may be used as a rinse solution that is used after the cleaning solution of the present invention.

EXAMPLES

Hereinafter, the present invention will be described specifically by way of examples, although the present invention should not be limited in any way to the following examples.
<Evaluated Substrates>

Following substrates were used.

For evaluation of the property of removing dry etching residue (Evaluation I): A bottom anti-reflection film composed of an organic substance (carbon, hydrogen, oxygen, nitrogen) (film thickness: 400 Å)

For evaluation of the property of removing a dry etching-stopper layer (Evaluation II): An aluminum oxide film (film thickness: 3000 Å)

For evaluation of anti-corrosion property for metal wiring (Evaluation III): A cobalt film (film thickness: 2000 Å)

For evaluation of the anti-corrosion property for interlayer dielectric film (Evaluation IV): A Low-k film composed of silicon, carbon, hydrogen, oxygen (film thickness: 3000 Å)
<Method for Preparing Substrates for Evaluations>

The bottom anti-reflection film and the Low-k film were each deposited on a silicon wafer by spin coating.

The aluminum oxide film was deposited on a silicon wafer by physical vapor deposition.

5000 Å-thick silicon oxide and 250 Å-thick titanium were sequentially deposited on a silicon wafer in this order, on which a cobalt film was formed by chemical vapor deposition.
<Evaluation Method>
[Treatment Conditions]

A test piece of the above-described evaluation substrate in a size of 1×1 cm or 2×2 cm was immersed in 10 g of the cleaning solution at 60° C. and the treated test piece was rinsed with water.
[Measurement of Film Thickness]

The film thicknesses of the bottom anti-reflection film, the aluminum oxide film and the Low-k film were measured with an optical film thickness gauge n&k model 1280 (available from n&k Technology). The decrease in the thickness of the cobalt film was calculated using ICP-AES iCAP 6300 (available from Thermo Scientific) based on the metal concentration in the cleaning solution after the treatment.

(Decrease in film thickness [Å]=Amount of metal dissolved in cleaning solution [g]×$10^8$/Density [g/$cm^3$]/Surface area of test piece [$cm^2$])

The etch rate [Å/min] was calculated by dividing the decrease in the film thickness by the treatment time (1 minute for the aluminum oxide film, 4 minutes for the cobalt film, and 5 minutes for the Low-k film).
Judgements;
(Evaluation I): Property of Removing Dry Etching Residue Judgement was made by the time that took for removing the bottom anti-reflection film (time at the point where the bottom anti-reflection film was peeled off and the underlying material was visible).
  G: less than 15 minutes
  A: 15 minutes to less than 30 minutes
  P: 30 minutes to 60 minutes
(Evaluation II): Property of Removing Aluminum Oxide Film Judgement was made by the etch rate of the aluminum oxide film.
  G: 15 Å/min to less than 50 Å/min
  A1: 10 Å/min to less than 15 Å/min
  A2: 50 Å/min to 60 Å/min
  P1: less than 10 Å/min
  P2: over 60 Å/min Judgements of G, A1 and A2 were considered acceptable.
(Evaluation III): Anti-Corrosion Property for Cobalt Judgement was made by the etch rate of the cobalt film.
  G: less than 1 Å/min
  P: 1 Å/min or more Judgement of G was considered acceptable.
(Evaluation IV): Anti-Corrosion Property for Low-k Film Judgement was made by the etch rate of the Low-k film.
  G: Less than 1 Å/min.
  P: 1 Å/min or more.

Judgement of G was considered acceptable.
[pH]

The pH of the cleaning solution was measured with pH METER F-52 available from HORIBA. The measurement temperature was 25° C.
[Viscosity]

The viscosity of the cleaning solution was measured with Ubbelohde viscometer available from Sibata Scientific Technology. The measurement temperature was 20° C.

Examples 1-22 and Comparative Examples 1-9

Cleaning solutions having the compositions indicated in Tables 1 and 2 were used for the treatment and evaluation of the above-described evaluation substrates. The unit of the concentrations indicated in Tables 1 and 2 is mass %. Evaluation IV was conducted for Examples 1-22, which were all judged G.

TABLE 1

| Example | Amine compound | | Water-soluble organic solvent | | Water | | | | |
|---|---|---|---|---|---|---|---|---|---|
| | Type | Concentration | Type | Concentration | Concentration | pH | I | II | III |
| 1 | n-Butylamine | 0.8 | DGME | 60 | 39.20 | 12.5 | G | G | G |
| 2 | n-Butylamine | 0.4 | DGME | 60 | 39.60 | 12.2 | G | A1 | G |
| 3 | n-Butylamine | 0.2 | DGME | 60 | 39.80 | 12.1 | G | A1 | G |
| 4 | n-Butylamine | 3.5 | DGME | 60 | 36.50 | 12.8 | G | G | G |

TABLE 1-continued

| Example | Amine compound Type | Concentration | Water-soluble organic solvent Type | Concentration | Water Concentration | pH | I | II | III |
|---|---|---|---|---|---|---|---|---|---|
| 5 | n-Butylamine | 4 | DGME | 60 | 36.00 | 12.8 | G | G | G |
| 6 | n-Butylamine | 0.8 | DGME | 55 | 44.20 | 12.4 | G | G | G |
| 7 | n-Butylamine | 0.8 | DGME | 50 | 49.20 | 12.3 | G | G | G |
| 8 | n-Butylamine | 0.8 | DGME | 45 | 54.20 | 12.3 | G | G | G |
| 9 | n-Butylamine | 0.8 | DGME | 40 | 59.20 | 12.3 | G | A2 | G |
| 10 | n-Butylamine | 0.8 | DGME | 65 | 34.20 | 12.4 | G | G | G |
| 11 | n-Butylamine | 0.8 | DOME | 70 | 29.20 | 12.5 | A | A1 | G |
| 12 | 1,4-Butanediamine | 0.96 | DGME | 60 | 39.04 | 12.7 | G | G | G |
| 13 | 3-Amino-1-propanol | 0.82 | DGME | 60 | 39.18 | 12.1 | G | G | G |
| 14 | Dibutylamine | 1.41 | DGME | 60 | 38.59 | 12.3 | A | G | G |
| 15 | Hexylamine | 1.10 | DGME | 60 | 38.90 | 12.3 | G | G | G |
| 16 | Octylamine | 1.41 | DOME | 60 | 38.59 | 12.0 | A | G | G |
| 17 | N,N-Diethyl-1,3-diaminopropane | 0.8 | DGME | 60 | 39.20 | 12.3 | A | G | G |
| 18 | Bis(hexamethylene)triamine | 0.8 | DGME | 60 | 39.20 | 12.5 | A | G | G |
| 19 | n-Butylamine | 0.8 | DGBE | 60 | 39.20 | 11.2 | G | G | G |
| 20 | n-Butylamine | 0.8 | TGME | 60 | 39.20 | 12.8 | G | G | G |
| 21 | n-Butylamine | 0.8 | DPGME | 60 | 39.20 | 11.5 | G | G | G |
| 22 | n-Butylamine | 0.8 | DMIB | 60 | 39.20 | 12.2 | G | G | G |

DGME: Diethylene glycol monomethyl ether (viscosity of 4 mPa · s at 20° C.)
DGBE: Diethylene glycol monobutyl ether (viscosity of 7 mPa · s at 20° C.)
TGME: Triethylene glycol monomethyl ether (viscosity of 8 mPa · s at 20° C.)
DPGME: Dipropylene glycol monomethyl ether (viscosity of 4 mPa · s at 20 C.)
DMIB: N,N-dimethyl isobutylamide (viscosity of 1 mPa · s at 20° C.)

TABLE 2

| Comparative example | Amine compound Type | Concentration mass % | Water-soluble organic solvent Type | Concentration (mass %) | Water Concentration (mass %) | pH | I | II | III |
|---|---|---|---|---|---|---|---|---|---|
| 1 | 1,2-Propanediamine | 0.81 | DGME | 60 | 39.19 | 12.2 | A | A1 | P |
| 2 | 1-Amino-2-propanol | 0.82 | DGME | 60 | 39.18 | 11.6 | A | P1 | P |
| 3 | 2-Amino-i-butanol | 0.98 | DGME | 60 | 39.02 | 11.6 | P | A1 | P |
| 4 | Ethylenediamine | 0.65 | DGME | 60 | 39.35 | 12.1 | G | G | P |
| 5 | Triethylamine | 1.10 | DGME | 60 | 38.90 | 12.1 | P | A1 | G |
| 6 | n-Butylamine | 0.8 | Glycerin | 60 | 39.20 | 11.4 | A | P1 | G |
| 7 | Hydroxylamine | 0.8 | DGME | 60 | 39.20 | 9.7 | P | P1 | G |
| 8 | n-Butylamine | 0.1 | DGME | 60 | 39.90 | 11.8 | A | P1 | G |
| 9 | n-Butylamine | 0.8 | DGME | 75 | 24.20 | 12.5 | A | P1 | G |

Glycerin: (viscosity at 20° C. is 1500 mPa · s)

EXPLANATIONS OF LETTERS OR NUMERALS

1: Dry etching residue
2: Dry etching-stopper layer
3: Metal wiring layer (cobalt)
4: Interlayer dielectric film

The invention claimed is:

1. A cleaning solution, comprising:
water:
an amine compound in a range of from 0.2 to 4.0 mass %; and
a water-soluble organic solvent in a range of from 40 to 70 mass %,
wherein the amine compound comprises at least one amine compound selected from the group consisting of n-butylamine, hexylamine, octylamine, 1,4-butanediamine, dibutylamine, N,N diethyl-1,3-diaminopropane and bis(hexamethylene)triamine, the water-soluble organic solvent has a viscosity of 10 mPa·s or less at 20° C., and pH of the cleaning solution is in a range of from 9.0 to 14.

2. The cleaning solution according to claim 1, wherein a content of the amine compound is in a range of from 0.5 to 4.0 mass %.

3. The cleaning solution according to claim 1, wherein a content of water is in a range of from 28 to 59 mass %.

4. The cleaning solution according to claim 1, wherein the water-soluble organic solvent comprises at least one solvent selected from the group consisting of diethylene glycol monomethyl ether, diethylene glycol monobutyl ether, triethylene glycol monomethyl ether, dipropylene glycol monomethyl ether and N,N-dimethyl isobutylamide.

5. The cleaning solution according to claim 1, wherein the amine compound comprises at least one of N,N-diethyl-1,3-diaminopropane and bis(hexamethylene)triamine.

6. The cleaning solution according to claim 1, wherein the cleaning solution is suitable for removing dry etching residue.

7. A method for manufacturing a semiconductor substrate, comprising:
cleaning a cobalt-containing semiconductor substrate with the cleaning solution of claim 1.

8. The method according to claim 7, wherein the cobalt-containing semiconductor substrate comprises a cobalt-containing metal wiring layer, an interlayer dielectric film and a dry etching-stopper layer containing aluminum oxide.

9. A method for manufacturing a semiconductor substrate, comprising:

cleaning a cobalt-containing semiconductor substrate with a cleaning solution, wherein the cobalt-containing semiconductor substrate comprises a cobalt-containing metal wiring layer, an interlayer dielectric film and a dry etching-stopper layer containing aluminum oxide, the cleaning solution comprises water, an amine compound in a range of from 0.2 to 20 mass %, and a water-soluble organic solvent in a range of from 40 to 70 mass %, and the amine compound in the cleaning solution comprises at least one amine compound selected from the group consisting of n-butylamine, hexylamine, octylamine, 1,4-butanediamine, dibutylamine, 3-amino-1-propanol, N,N-diethyl-1,3-diaminopropane and bis(hexamethylene)triamine, the water-soluble organic solvent in the cleaning solution has a viscosity of 10 mPa·s or less at 20° C., and pH of the cleaning solution is in a range of from 9.0 to 14.

10. The cleaning solution according to claim 2, wherein a content of water is in a range of from 28 to 59 mass %.

11. The cleaning solution according to claim 2, wherein the water-soluble organic solvent comprises at least one solvent selected from the group consisting of diethylene glycol monomethyl ether, diethylene glycol monobutyl ether, triethylene glycol monomethyl ether, dipropylene glycol monomethyl ether and N,N-dimethyl isobutylamide.

12. The cleaning solution according to claim 2, wherein the amine compound comprises at least one of N,N-diethyl-1,3-diaminopropane and bis(hexamethylene)triamine.

13. The cleaning solution according to claim 3, wherein the water-soluble organic solvent comprises at least one solvent selected from the group consisting of diethylene glycol monomethyl ether, diethylene glycol monobutyl ether, triethylene glycol monomethyl ether, dipropylene glycol monomethyl ether and N,N-dimethyl isobutylamide.

14. The cleaning solution according to claim 3, wherein the amine compound comprises at least one of N,N-diethyl-1,3-diaminopropane and bis(hexamethylene)triamine.

15. The cleaning solution according to claim 4, wherein the amine compound comprises at least one of N,N-diethyl-1,3-diaminopropane and bis(hexamethylene)triamine.

16. The cleaning solution according to claim 1, wherein a content of the water-soluble organic solvent is in a range of from 45 to 65 mass %.

17. The cleaning solution according to claim 1, wherein a content of water is in a range of from 34 to 54 mass %.

18. The cleaning solution according to claim 1, wherein the pH of the cleaning solution is in a range of from 11 to 13.

19. The cleaning solution according to claim 13, wherein the amine compound comprises at least one of N,N-diethyl-1,3-diaminopropane and bis(hexamethylene)triamine.

20. The method according to claim 9, wherein a content of water is in a range of from 28 to 59 mass %, and the water-soluble organic solvent comprises at least one solvent selected from the group consisting of diethylene glycol monomethyl ether, diethylene glycol monobutyl ether, triethylene glycol monomethyl ether, dipropylene glycol monomethyl ether and N,N-dimethyl isobutylamide.

* * * * *